(12) United States Patent
Ogawa

(10) Patent No.: US 6,774,468 B2
(45) Date of Patent: Aug. 10, 2004

(54) POWER SEMICONDUCTOR DEVICE

(75) Inventor: Takeshi Ogawa, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/656,211

(22) Filed: Sep. 8, 2003

(65) Prior Publication Data
US 2004/0070066 A1 Apr. 15, 2004

(30) Foreign Application Priority Data
Oct. 10, 2002 (JP) .................................. 2002-297407

(51) Int. Cl.$^7$ ................................. H01L 23/48
(52) U.S. Cl. ............... 257/678; 257/693; 257/710; 257/729; 257/730; 257/731
(58) Field of Search ............................. 257/678, 693, 257/710, 729–731

(56) References Cited

U.S. PATENT DOCUMENTS 5,373,105 A * 12/1994 Nagaune et al. ........ 174/52.2
5,825,085 A * 10/1998 Masumoto et al. ......... 257/704
6,088,226 A * 7/2000 Rearick ..................... 361/704
6,521,983 B1 * 2/2003 Yoshimatsu et al. ....... 257/678

FOREIGN PATENT DOCUMENTS

| JP | 7-66310 | 3/1995 |
| JP | 9-129823 | 5/1997 |
| JP | 2000-74016 | 3/2000 |

* cited by examiner

Primary Examiner—George Eckert
Assistant Examiner—Matthew E. Warren
(74) Attorney, Agent, or Firm—Oblon, Spivak, McClelland, Maier & Neustadt, P.C.

(57) ABSTRACT

A polygonal nut 5 for receiving a clamping bolt 7 is securely inserted in a nut insertion hole 6 which is formed in the thin portion 1a of the resin case 1, and the polygonal nut is engaged with an inner surface 6a of the nut insertion hole 6. The inner surface 6a of the nut insertion hole 6 has a round-shaped notch concave portion 6b formed at a position confronting to a corresponding corner portion 5b of the polygonal nut 5 so that the corner portion 5b of the polygonal nut 5 is not in contact with a resin case member to thereby prevent the resin case from being cracked.

4 Claims, 3 Drawing Sheets

POWER SEMICONDUCTOR DEVICE

BACKGROUND OF THE INVENTION

1. Field of the Invention

The present invention relates to a power semiconductor device, and particularly relates to a power semiconductor device which improves a molding shape of a resin case while a nut is embedded in a thin portion of the resin case for connecting an external electrode to another semiconductor device.

2. Description of the Prior Art

In general, a power semiconductor device (hereinafter, also referred to as "semiconductor power module") such as an insulating gate type bipolar transistor (IGBT) transforms an input direct current into an alternating current having arbitrary frequency by utilizing a semiconductor and outputs the alternating current. The power semiconductor devices are used for motor control, an inverter according to various kinds of application, an uninterruptible power supply (UPS), or the like. Usually the semiconductor power module is formed in a shape of a quadrilateral, and various kinds of functional parts are provided on a cooling metal base of a quadrilateral, and an outside of the semiconductor power module is covered with a resin case.

An insulating substrate is fixed to the cooling metal base, and a circuit pattern is fixedly formed on a surface of the insulating substrate. A plurality of semiconductor chips is mounted on the circuit pattern, a terminal of each semiconductor chip is connected to an electrode plate, and the circuit pattern is connected to another electrode plate. These electrode plates are insulated from each other and extended toward the outside of the resin case, and each electrode plate forms a main circuit terminal for external connection. An inside of the resin case is filled with a silicone gel or the like material for protecting the semiconductor chip and other parts.

Thus, an insulating layer or an insulating metallized substrate is provided on the metal base (i.e., radiator plate), the semiconductor chip is soldered onto the insulating layer or the insulating metallized substrate, and the resin case having a resin cover is fixed to the metal base plate with an adhesive or a screw. The electrode portion to be connected to another semiconductor device is formed as an external lead connecting end portion of the main circuit terminal.

In the above-described semiconductor power module, a hexagonal nut is inserted in and fixed to the resin case as a nut for receiving a bolt, which is located in a lower portion of the electrode portion for external lead connection. That is to say, these hexagonal nuts are inserted in and fixed to hexagonal nut insertion holes, which are formed in the thin portions of the resin case, at a backside of the external lead connecting end portion side of the main circuit terminal, and are arranged adjacent to each other. Electric connection is performed in such a manner that, each of the hexagonal nut insertion hole is formed corresponding to the shape of each hexagonal nut to thereby insert the hexagonal nut when the resin case is molded, and an upper portion of the electrode is folded, and the hexagonal nut is clamped to another semiconductor device with a bolt or the like.

On the other hand, in the clamping construction of the resin case of the conventional semiconductor power module, there is disclosed a technique in which an S-shaped metal cylinder is inserted in a screw portion for a structure preventing a crack caused by stress concentration (for example, see Patent Document 1: Japanese Patent Laid-Open No. H9-129823.

There is disclosed another construction preventing the crack by a structure in which a notch portion of a corner portion is rounded in the resin case (for example, see Patent Document 2: Japanese Patent Laid-Open No. H7-66310).

There is disclosed further another construction in which a slit-shaped groove is formed in a resin member bolted with a screw and destruction of the resin case is prevented by utilizing a partial elastic function (for example, see Patent Document 3: Japanese Patent Laid-Open No. 2000-74016).

However, in the conventional semiconductor power module, because of a problem such as interchangeability of an outside dimension, it is necessary to reduce a thickness of the resin case in which the hexagonal nut for receiving a clamping bolt is inserted to be fixed. When the hexagonal nut in the thin portion of the resin case is clamped to another semiconductor device with a bolt, the stress is concentrated on the corner portion of the hexagonal nut between the hexagonal nut inserted in the resin case and the resin case, and there is a problem such that the thin portion of the resin case cannot withstand the stress during the clamping and there occurs a crack in the thin portion of the resin case.

In order to prevent the resin case from cracking at the corner portion, it is necessary in the conventional construction to increase a thickness of the resin case, which results in an increase in the case size to be a problem. In order to prevent an external screw and the nut from loosening, a member such as a spring washer is required, which results in that the number of parts is increased, and the assembly and disassembly operation are problematically increased.

On the other hand, the construction disclosed in Patent Document 1 is the technique which prevents the crack from occurring in the resin case, by supporting a force of the bolting with the S-shaped metal cylinder. However, it is necessary that the S-shape metal cylinder is produced with a forming process which is more complicated than the usual polygonal nut, and therefore it is not easy to embed and fix the S-shaped metal cylinder to the resin case unlike nut insertion. Accordingly, a projecting portion from the resin case is provided, so that the thickness after the assembly is also increased as a whole.

The construction disclosed in Patent Document 2 is the technique in which a chamfer portion is formed at the corner portion of an aperture end face in the resin case so that the stress concentration on the corner portion is prevented when the inserted electrode terminal is folded. However, it is not disclosed in this document to prevent the generation of the crack which is caused by the concentration of the clamping stress of the polygonal nut on the corner portion of the nut when clamped with a bolt.

The construction disclosed in Patent Document 3 is to include a slit extending radially toward a lower hole formed in a base board. However, it is not disclosed in this document to improve a corresponding position of the corner portion of the nut in the nut insertion hole formed in a resin thin film member.

In view of the foregoing, it is an essential object of the present invention to provide a power semiconductor device in which the crack in the resin case can be prevented from generating at the corner portion of the hexagonal nut, while suppressing the increase in thickness of the resin case, and miniaturization of the resin case can be achieved.

It is another object of the present invention to provide a power semiconductor device in which the external screw and the nut are prevented from loosening with the easy construction, the spring washer is not required, the number of parts is decreased, assembly and disassembly are quite convenient, and productivity is excellent.

SUMMARY OF THE INVENTION

In order to achieve the objects mentioned above, the present invention provides a power semiconductor device which includes a resin case for covering and protecting an outer surface of the power semiconductor device. The resin case has a thin portion integrally outward projected therefrom. An external connecting terminal portion of a main circuit terminal extends outward from the resin case, wherein the thin portion of the resin case is formed on a backside of the external connecting terminal portion. A polygonal nut for receiving a clamping bolt is securely inserted in a nut insertion hole which is formed in the thin portion of the resin case. Thus, the polygonal nut is engaged with an inner surface of the nut insertion hole. In this construction, the inner surface of the nut insertion hole has a round-shaped notch concave portion formed at a position confronting to a corresponding corner portion of the polygonal nut so that the corner portion of the polygonal nut is not in contact with a resin case member.

BRIEF DESCRIPTION OF THE DRAWINGS

These and other objects and features of the present invention will be readily understood from the following detailed description taken in conjunction with preferred embodiments thereof with reference to the accompanying drawings, in which:

FIG. 1A is a plan view and FIG. 1B is a side view thereof;

DETAILED DESCRIPTION OF THE PREFERRED EMBODIMENTS

Figure 1B:
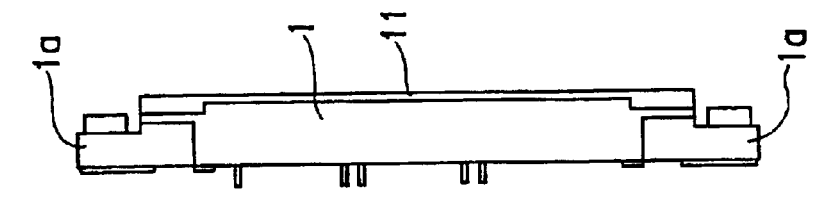
FIGS. 1A and 1B show a schematic construction of a semiconductor power module according to the invention, where

Before the description proceeds, it is to be noted that, since the basic structures of the preferred embodiments are in common, like parts are designated by the same reference numerals throughout the accompanying drawings, and the overlapping description is omitted.

The preferred embodiments of the invention will be described below referring to the accompanying drawings. In the embodiments of the invention, though an assembly construction of a high power 6-pack trench module is illustrated as a semiconductor device, the present invention is not limited to this assembly construction and can be applied to the cases in which various kinds of semiconductor devices are used.

First Embodiment

Figure 1A:
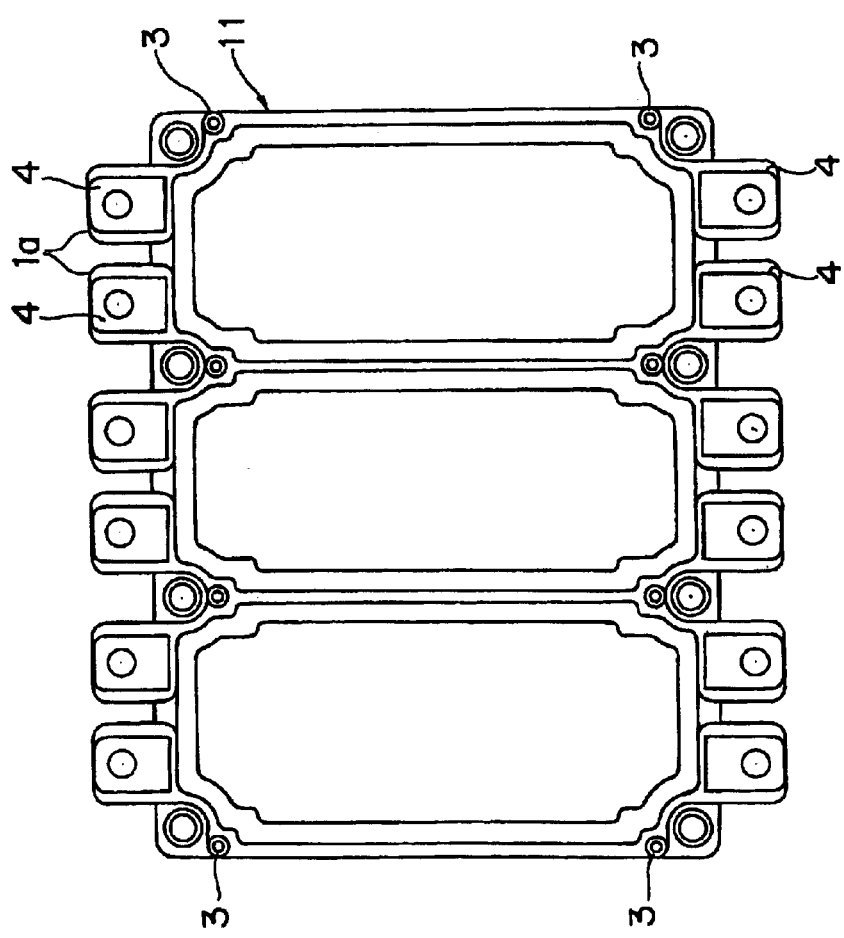

FIG. 1A is a plan view of the semiconductor power module according to the first embodiment of the invention, and FIG. 1B is a side view of the semiconductor power module. In the semiconductor power module shown in FIGS. 1A and 1B, an insulating layer or an insulating metallized substrate is provided on a metal base plate 11 serving as a radiator plate which functions as a heat sink. A semiconductor chip is soldered on the insulating layer or the insulating metallized substrate, and a resin case 1 for packaging having a resin cover is fixed to the metal base plate with screws 3.

Electrode connecting terminal portions 4 connected to another semiconductor devices are formed as external lead connecting end portions of the main circuit terminals. The semiconductor power module is formed in the shape of a quadrilateral, in which various kinds of functional parts described later are mounted on the cooling metal base in the shape of the quadrilateral, and the outer surfaces thereof are surrounded with the resin case 1.

In specific, as shown in FIG. 1A, the insulating substrate is fixed to the cooling metal base 11 and a circuit pattern is fixedly formed on the surface of the insulating substrate. A plurality of semiconductor chips are mounted on the circuit pattern, and each terminal of each semiconductor chip is connected to each electrode connecting terminal plate 4, and the circuit pattern is connected to another electrode connecting terminal plate.

These electrode connecting terminal plates 4 extend outward from the resin case 1 while the electrode connecting terminal plates 4 are insulated from each other. Thus, the electrode connecting terminal plates 4 form the main circuit terminals for external connection. The inside of the resin case 1 is filled with a filler such as silica gel, which protects parts such as the semiconductor chips. Various control terminals (not shown) are arranged in an edge portion of one side of the quadrilateral semiconductor power module.

Figure 2:
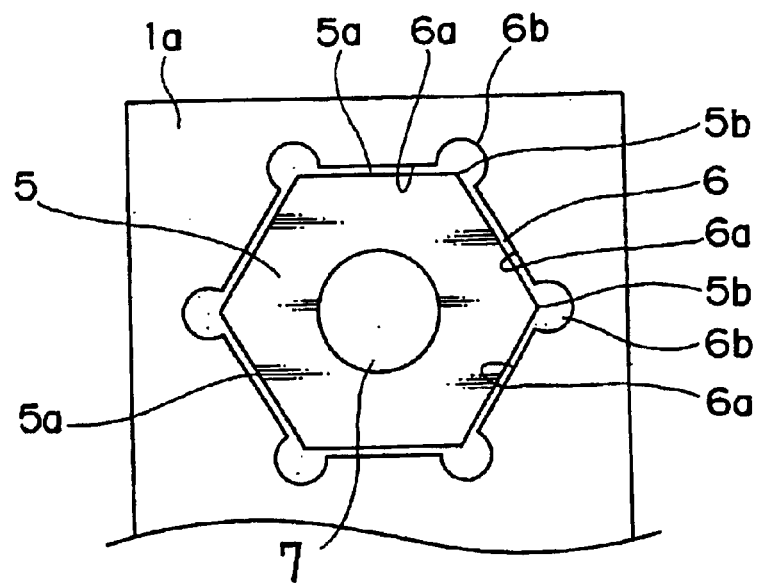
FIG. 2 is an enlarged view of a main part of a connecting terminal portion of the semiconductor power module according to a first embodiment of the invention.

FIG. 2 is an enlarged view of a main part of the electrode connecting terminal portion 4, and shows a state in which a hexagonal nut 5 for receiving a bolt, located below a lower portion of the electrode, is fixedly inserted in the resin case 1.

More specifically, the hexagonal nut 5 is inserted in and fixed to a hexagonal nut insertion hole 6, which is formed in a thin portion 1a of the resin case 1, at the backside of the external lead connecting end portion 4 of the main circuit terminals which are arranged adjacent to each other. The hexagonal nut insertion hole 6 is formed corresponding to the shape of the hexagonal nut 5 so that the hexagonal nut 5 is inserted therein when the resin case 1 is molded, and the hexagonal nut 5 is clamped to another semiconductor device with a bolt or the like to perform the connection.

Further, in the construction adapted in the preferred embodiment, the hexagonal nut 5 is mounted in the lower portion of the mounting electrode for connecting another semiconductor device while the outside portion of the hexagonal nut 5 may be in partial contact with an inside surface 6a of the hexagonal nut insertion hole 6 which is formed in the thin portion 1a of the resin case 1.

In this way, the inside surface 6a of the hexagonal nut insertion hole 6 performs fixation of the outside portion of the hexagonal nut 5 in such a manner that the inside surface 6a is in partial contact with the confronting outside surface 5a of the hexagonal nut 5, which is adjacently opposed to the inside surface 6a of the hexagonal nut insertion hole 6.

In the thin portion 1a of the resin case 1, the hexagonal nut insertion hole 6 is formed so that a corner portion 5b of the outside of the hexagonal nut 5 is not in contact with the resin case member, when the hexagonal nut 5 is embedded during the molding of the resin case.

Concretely, as shown in FIG. 2, in order that the corner portion 5b of the hexagonal nut is not in contact with the resin case member 1, in the thin portion 1a of the resin case, a round-shaped notch concave portion 6b is formed at six positions corresponding to the corner portion 5b of the mounted hexagonal nut in the inside portion 6a of the hexagonal nut insertion hole 6.

Thus, the corner portion 5b of the hexagonal nut 5 is not in contact with the inside portion of the hexagonal nut insertion hole 6 when the hexagonal nut 5 is embedded in the hexagonal nut insertion hole 6. Consequently, the structure in which the corner portion 5b of the hexagonal nut is not in contact with the resin case is obtained in clamping with a bolt, and a stress is prevented from concentrating on the corner portion of the hexagonal nut 5 when clamping.

Figure 3:
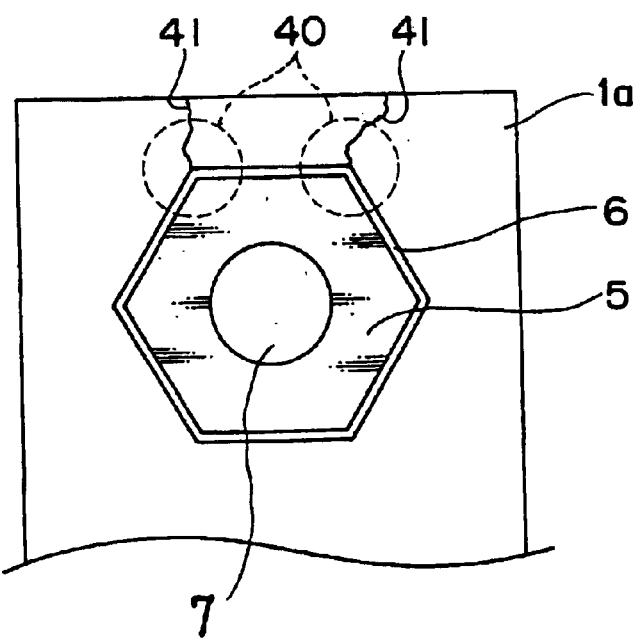
FIG. 3 is an enlarged view of a main part of the connecting terminal portion of a comparative example in which a round-shaped notch is not formed at a diagonal corner position.

On the other hand, FIG. 3 shows a construction as a comparative example in which such a round-shaped notch portion is not formed at the position corresponding to the corner portion of the hexagonal nut. In the comparative example shown in FIG. 3, since the round-shaped notch portion is not formed at the position corresponding to the corner portion 5b of the hexagonal nut in the inside portion of the hexagonal nut insertion hole 6, when the hexagonal nut is embedded in the hexagonal nut insertion hole in the thin portion of the resin case, the corner portion of the hexagonal nut comes into contact with the inside portion of the hexagonal nut insertion hole. Accordingly, the stress is concentrated on a portion 40 corresponding to the corner portion of the hexagonal nut when bolting with a clamping bolt 7, and sometimes a crack 41 is generated at the corner portion in the thin portion of the resin case.

In the present embodiment, such a conventional problem is effectively solved by improving the structure of the inside portion of the nut insertion hole so that the inside portion of hexagonal nut insertion hole is not in contact with the corner portion of the hexagonal nut.

That is to say, by adopting the non-contact structure, the notch concave portion 6b is located between the adjacent inside surfaces 6a at the position corresponding to the corner portion 5b of the hexagonal nut in the inside portion of the hexagonal nut insertion hole 6, to achieve relaxation of strain caused by the stress in the thin portion 1a of the resin case during the bolting, and to prevent the resin case from cracking.

In the present embodiment, though the hexagonal nut is used for receiving a bolt, the invention is not limited to the hexagonal nut, and an arbitrary polygonal nut can be used as the shape of the nut.

As described above, in the semiconductor power module according to the embodiment, between the inside surfaces of the nut insertion hole, the corner portion corresponding to the corner potion of the outside surface of the polygonal nut is eliminated and the round-shaped notch concave portion is provided instead.

Thus, the embodiment can prevent the conventional problem of the stress concentrated on the corner portion between the inside surfaces of the hexagonal nut insertion hole by clamping torque applied to the nut and prevent the resin case from being cracked at the corner portion. Also, it is not particularly necessary to increase a thickness of the resin case, and resultant miniaturization of the resin case can be achieved.

Figure 4:
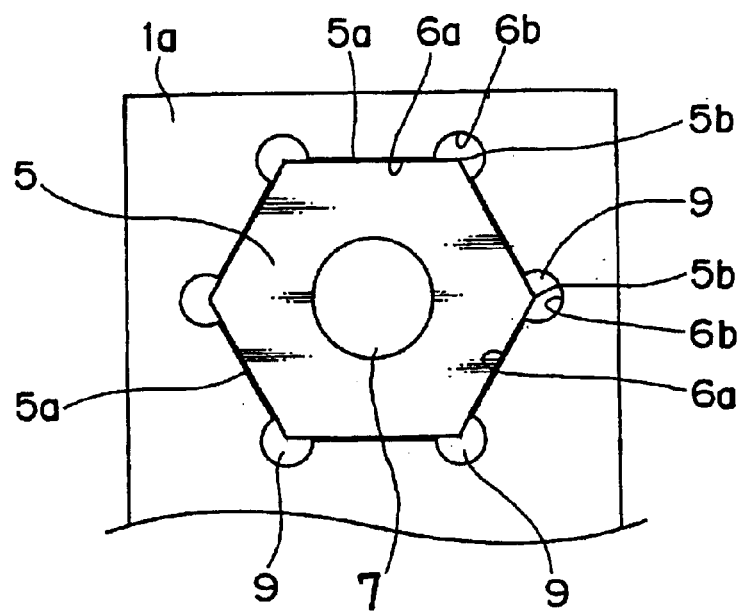
FIG. 4 is an enlarged view of a main part of the connecting terminal portion of the semiconductor power module according to a modification of the first embodiment of the invention.

FIG. 4 shows a modification of the embodiment, in which the thin portion 1a of the resin case is reinforced by filling an elastic member 9 such as rubber to the round-shaped notch concave portion 6b formed at the position corresponding to the corner portion 5b of the hexagonal nut, and which may have a function that the clamping torque applied to the hexagonal nut is absorbed by utilizing the elasticity.

Consequently, the strain caused by the stress in the thin portion 1a of the resin case can be further released during the bolting, and the resin case can be more effectively prevented from cracking.

Second Embodiment

Figure 5:
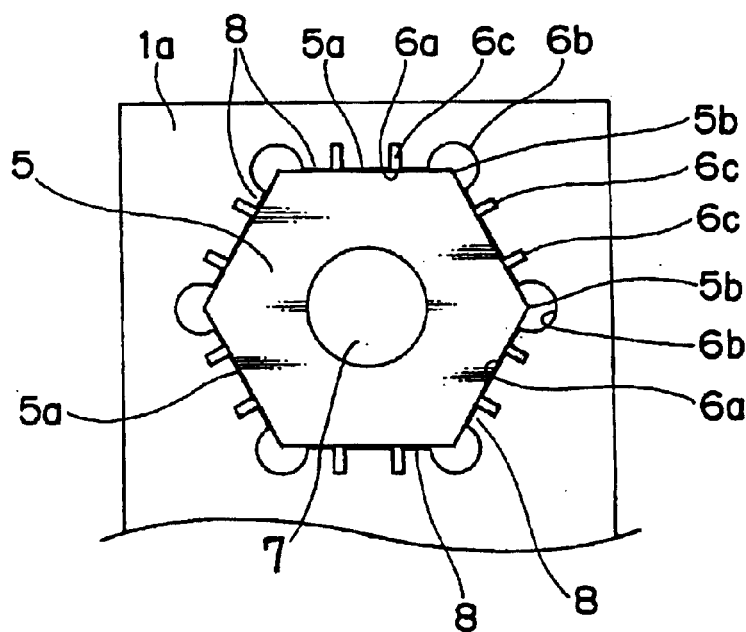
FIG. 5 is an enlarged view of a main part of the connecting terminal portion of the semiconductor power module according to a second embodiment of the invention.

FIG. 5 shows an enlarged main part of an electrode connecting terminal portion 4 according to a second embodiment of the present invention. The second embodiment shown in FIG. 5 is a modification of the first embodiment shown in FIG. 2, and FIG. 5 shows a state in which the hexagonal nut 5 of the lower portion of the electrode is inserted in and fixed to the thin portion 1a of the resin case in the electrode connecting terminal portion 4.

As shown in FIG. 5, in the inside surface 6a of the hexagonal nut insertion hole 6 which is in contact with the outside surface 5a of the hexagonal nut inserted in the resin case 1, a plurality of slot grooves 6c are formed radially. The plurality of slot grooves are used for forming a torque buffer portions 8 each having a partial elastic effect. The torque buffer portions 8 is formed as a convex portion 8 of the thin portion 1a of the resin case for absorbing the clamping torque where the convex portion 8 is projected inwardly at a given position in the inside portion of the hexagonal nut insertion hole 6 in the resin case.

In specific, the slot grooves 6c are formed at symmetric positions of both sides near each notch portion 6b which is formed at the position corresponding to the corner portion 5b of the hexagonal nut, and the torque buffer portions 8 of the resin case member are located at positions sandwiched between each notch concave portion 6b and the slot grooves 6c at the both sides thereof. Thus, each of the torque buffer portions 8 is formed as a projection (convex portion) of the resin case member projected inwardly to the hexagonal nut insertion hole 6.

As described above, when a external screw 7 engages the hexagonal nut 5 and the inside surface 6a of the hexagonal nut insertion hole 6 comes into contact with the corresponding outside surface 5a of the hexagonal nut 5, the clamping torque buffer portion 8 is forced to be deformed by pressure contact with the corresponding portion of the outside surface 5a of the hexagonal nut 5. The clamping torque applied to the hexagonal nut can be absorbed by utilizing the elastic effect of the deformation.

According to the present embodiment, the torque buffer portion absorbs the clamping torque by the elasticity of the deformation during the clamping with a bolt, and acts against loosening of the external screw from the nut. Therefore, a spring washer is not particularly required, and the number of parts can be reduced, and it is quite convenient in assembling and disassembling. Consequently, there can be obtained an effect in performing the assembling and disassembling with excellent productivity.

As described above, according to the present invention, since there is no corner portion between the inside surfaces of the nut insertion hole corresponding to the corner potion of the outside surface of the polygonal nut, the improvement in construction can eliminate the conventional problem of the stress concentrated on the corner portion between the inside surfaces of the hexagonal nut insertion hole due to the clamping torque applied to the nut, preventing the resin case from being cracked at the corner portion thereof. Also, it is not particularly necessary to increase the thickness of the resin case, and the miniaturization of the resin case can be achieved.

What is claimed is:

1. A power semiconductor device comprising:
    a resin case for covering and protecting an outer surface of the power semiconductor device, the resin case having a thin portion integrally projected outward therefrom;
    an external connecting terminal portion of a main circuit terminal, which extends outward from the resin case, wherein the thin portion of the resin case is formed on a backside of the external connecting terminal portion; and
    a polygonal nut for receiving a clamping bolt, the polygonal nut securely inserted in a nut insertion hole which is formed in the thin portion of the resin case, wherein the polygonal nut is engaged with an inner surface of the nut insertion hole,
    wherein the inner surface of the nut insertion hole has a round-shaped notch concave portion formed at a position confronting to a corresponding corner portion of the polygonal nut so that the corner portion of the polygonal nut is not in contact with a resin case member.

2. The power semiconductor device according to claim 1, wherein a slot grooves are radially formed at both sides near the notch concave portion in the inner surface of the nut insertion hole, so that a torque buffer portion for absorbing a clamping torque is formed in a shape of a projection integrally projected as a part of the resin case between the notch concave portion and the slot grooves at both sides thereof.

3. The power semiconductor device according to claim 2, wherein the round-shaped notch concave portion in the inner surface of the nut insertion hole is filled with an elastic member made of rubber.

4. The power semiconductor device according to claim 1, wherein the round-shaped notch concave portion in the inner surface of the nut insertion hole is filled with an elastic member made of rubber.

* * * * *